May 9, 1967

HUGH L. DRYDEN, DEPUTY ADMINISTRATOR OF THE NATIONAL AERONAUTICS AND SPACE ADMINISTRATION 3,319,175

ELECTRONIC AMPLIFIER WITH POWER SUPPLY SWITCHING

Filed July 27, 1964

2 Sheets-Sheet 1

Manuel Kramer

INVENTOR

BY [signature]

ATTORNEYS

May 9, 1967 HUGH L. DRYDEN, DEPUTY ADMINISTRATOR OF THE NATIONAL AERONAUTICS AND SPACE ADMINISTRATION 3,319,175

ELECTRONIC AMPLIFIER WITH POWER SUPPLY SWITCHING

Filed July 27, 1964 2 Sheets-Sheet 2

Manuel Kramer
INVENTOR

BY [signature]
ATTORNEYS 3,319,175
ELECTRONIC AMPLIFIER WITH POWER SUPPLY SWITCHING
Hugh L. Dryden, Deputy Administrator of the National Aeronautics and Space Administration, with respect to an invention of Manuel Kramer, South Lincoln, Mass.
Filed July 27, 1964, Ser. No. 385,530
8 Claims. (Cl. 330—22)

ABSTRACT OF THE DISCLOSURE

An apparatus for increasing the power conversion efficiency of electronic amplifiers by means of power supply switching. The apparatus utilizes a multilevel D.C. voltage supply. Comparator circuits continuously monitor the voltage across the load connected to the amplifier output and compare it with reference voltages of the power supply. In accordance with load voltage demands, a switching circuit associated with each comparator selectively connects a power supply voltage across the power amplifying element of the amplifier whereby the minimum voltage of the available power supply voltages sufficient to maintain linear operating characteristics of the amplifier is applied across the power amplifying element.

The invention described herein was made in the performance of work under a NASA contract and is subject to the provision of section 305 of the National Aeronautics and Space Act of 1958, Public Law 85–568 (72 stat. 435; U.S.C. 2457).

This invention relates to a method and apparatus for increasing the power conversion efficiency of electronic amplifiers, and more particularly to a method and apparatus for increasing the power conversion efficiency of a class B electronic amplifier by means of power supply switching.

With the advent of satellites and space vehicles operating from limited sources of electric energy has come an increasing demand for more efficient use of the available electric power. Considerable research and expense has been directed towards the achievement of this goal and in particular to the increased power efficiency of electronic amplifiers. This invention relates to a method and means for increasing class B amplifier circuit efficiency by incorporating both analogue and switching techniques.

During signal amplification in a class B transistor amplifier, the transistor operates as a control device by regulating the amount of supply voltage applied to the load. Since the power dissipated in the transistor during this controlling process is proportional to the product of the load current and the transistor (collector to emitter) voltage, the higher the transistor voltage for a given current the greater is the power dissipated in the collector of the transistor. Since transistor power losses represent a decrease in circuit power conversion efficiency, the control device voltage should be kept at a minimum for all levels of load current if efficiency is to be maximized.

This invention utilizes a novel technique to keep the transistor voltage at a more optimum value by employing a multiple-level switching supply voltage. The power amplifiers most suitably adapted for this application are configurations which have a high dynamic output impedance, such as the grounded base and grounded emitter transistor configurations, in order that the load current be independent of transistor voltage. The technique of this invention provides the circuit with several small voltage supplies connected in series. The several incremental voltages are generated in practice by a multi-tapped secondary output transformer winding of a static transformer coupled converter which is driven by an external source or a self-synchronous oscillator. With this type supply the full battery voltage is used rather than taps from individual cells which would create a battery charging problem. The transistor voltages are detected by threshold detector circuits which provide input signals to saturating transistor switches for selectively connecting the multiple supply levels to a common output terminal going to the circuit.

The scheme of this invention is, therefore, to measure the voltage across the transistor and switch to a higher supply voltage tap when the measured voltage is below a minimum required level or switch to a lower voltage tap when the measured voltage is larger than a predetermined maximum value. Thus, the supply voltage increases by steps as the transistor voltage decreases to a minimum value and decreases by steps when the transistor voltage rises to a maximum value. As a result, the transistor voltage is limited by use of a multi-level supply voltage and the circuit efficiency increases relative to the number of voltage supply increments used in the circuit operation.

Although the technique of this invention is applicable to both D.C. and A.C. power amplifiers, an A.C. amplifier requires a power supply with multi-levels of only uni-polar voltage whereas the D.C. amplifier requires a power supply with complementary levels of both positive and negative voltages. The theoretical upper limit of efficiency for a class B amplifier having a fixed primary power supply when driven to saturation by a sine wave is 78.5% but in actual practice does not exceed 70%. By use of the present invention, efficiencies higher than the 78.5% limit have been attained and the theoretical upper limit of power conversion efficiency approaches 100% as the number of primary supply voltage levels is increased. The practicality of a large number of supply voltage levels depends on the specific application and the choice of supply voltage levels is dependent on the character of the output signal.

Other objects and many of the attendant advantages of this invention will be readily appreciated as the same become better understood by reference to the following detailed description when considered in connection with the accompanying drawings in which like reference numerals designate like parts throughout the figures thereof and wherein.

Figure 1:
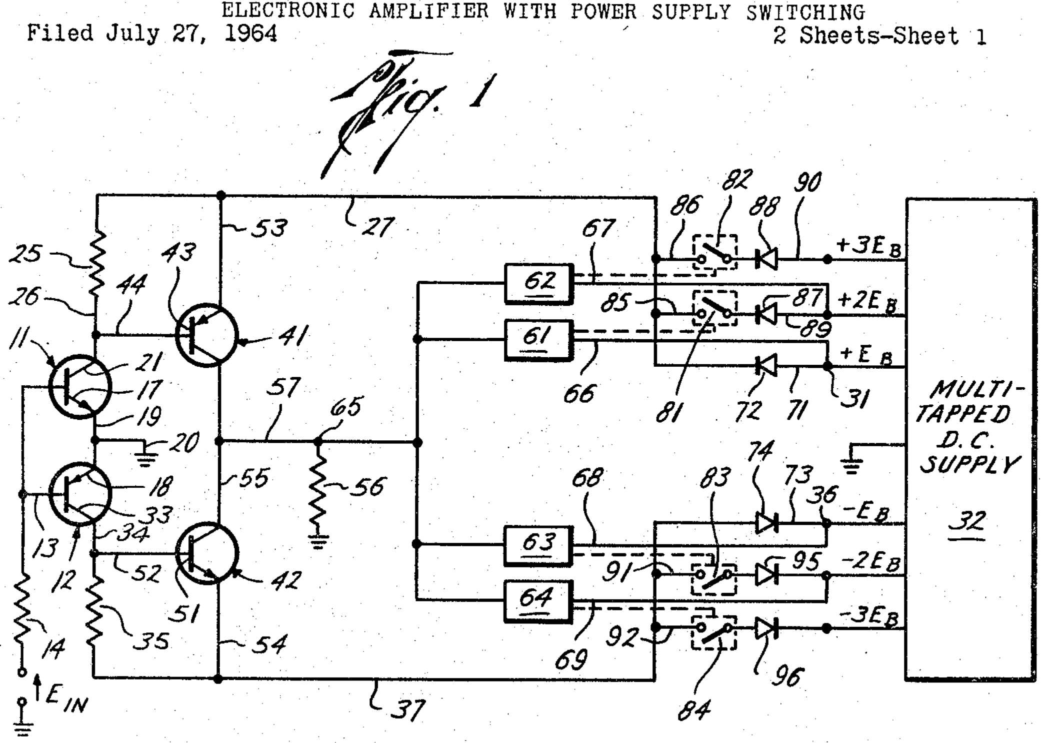
FIG. 1 is a schematic circuit diagram of a D.C. amplifier with a multi-level supply voltage in accordance with the invention.

Referring more particularly to the drawings, there is shown in FIG. 1 a D.C. class B amplifier with a multi-tapped D.C. power supply in accordance with this invention. The amplification stage comprises two pairs of complementary transistors. The first pair consists of a type NPN transistor 11 and a type PNP transistor 12 arranged in a common emitter stage for driving the output stage comprising the second pair of transistors. The base terminals of transistors 11 and 12 are coupled to one another by a conductor 13 and also to a coupling resistor 14 through which the input voltage signal is delivered. The emitters 17 and 18 of transistors 11 and 12, respectively, are coupled to one another by a conductor 19 and to ground through a conductor 20. The collector terminal 21 of the transistor 11 is coupled through a resistive load 25 by means of conductor 26 and power conductor 27 to the positive terminal 31 of a multi-tapped D.C. power supply 32 which provides positive voltage for reverse biasing the collector-base junction. The collector 33 of the transistor 12 is connected by a conductor 34 to one terminal of a resistive load 35 which at its other terminal is connected to the negative terminal 36 of the power supply 32 by the power conductor 37. Thus, negative voltage is provided for reverse biasing the collector-base junction of transistor 12. The complementary symmetry arrangement of the transistors permits class B operation without the need of a phase inverter since only a single ended input is needed.

The second pair of complementary transistors in the output stage of the amplifier is comprised of a PNP transistor 41 and an NPN transistor 42 which are also arranged in a common emitter configuration. The base terminal 43 of transistor 41 is coupled to the collector of transistor 11 by the conductors 44 and 26 and the base terminal 51 of transistor 42 is coupled to the collector of transistor 12 by conductors 52 and 34. The emitter terminals of these transistors are connected by conductors 53 and 54, respectively, to the power conductors 27 and 37, respectively, which provide voltages to the emitter-base junctions of these transistors. The collector terminals of the transistors 41 and 42 are joined by a conductor 55. The output of the amplification stage is taken across the terminals of a resistive load 56 which is connected to ground and to conductor 55 by the conductor 57. The resistive load 56 may represent any device to which the amplified power is delivered.

During circuit operation when the input voltage signal is positive, transistor 11 conducts and, because of 180° phase reversal in the common emitter configuration, the collector of transistor 11 goes negative which causes transistor 41 to conduct. Transistor 12 remains nonconducting. When the voltage input signal is negative, transistor 12 conducts and its collector goes positive which causes the transistor 42 to conduct. Not only is power gain obtained with the common emitter configuration, but also a high output impedance.

In order to insure that the output transistors 41 and 42 acts as control elements for regulating the amount of supply voltage applied to the load, it is only necessary to maintain a small voltage across the transistor. A large excess transistor voltage merely increases power dissipation and has only a second order effect on the load voltage. Since the transistor power losses represent a decrease in circuit power conversion efficiency (which is defined as the ratio of signal power delivered to the load to the total power delivered to the circuit) the transistor voltage should be kept at near minimum operating value for all levels of load current if efficiency is to be increased. By the method and apparatus of this invention the voltage across the output transistors is continuously measured and compared with predetermined maximum and minimum values. When the measured voltage is below a minimum level a higher supply voltage is switched to the emitters of the output transistors, and when the measured voltage exceeds a predetermined maximum value, a lower voltage is switched to the emitters of the output transistors.

The voltage sampling stage in the amplifier configuration of FIG. 1 consists of two pairs of voltage amplitude comparators. The first pair of comparators 61 and 62 are used to compare the positive swing of the output voltage emitted by the amplification stage with reference levels of positive voltage available from the D.C. power supply, and the second pair of comparators 63 and 64 are used to compare negative swings of the amplified output voltage with reference levels of negative voltage which are also available from the power supply. Accordingly, one terminal of each comparator is coupled to the output terminal 65 of the amplification stage by associated conductors to permit the sampling of the output voltage. The other terminals of the first pair of comparators 61 and 62 are connected by conductors 66 and 67, respectively, to the positive side of the D.C. power supply which provides two different levels of positive voltage with which the voltage amplitude of the output signal can be compared. In like manner, the other terminals of the second pair of comparators 63 and 64 are connected by conductors 68 and 69, respectively, to the negative side of the D.C. power supply which provides two different levels of negative voltage with which negative amplitudes of an output signal are compared. For the purpose of this description an amplitude comparator (with zero hysteresis) is defined as an electronic circuit which compares the amplitude of a variable input signal with a reference input and closes or opens a switch when the variable signal input is larger than the reference and switches back when the signal input is lower than the reference.

In the amplifier system illustrated in FIG. 1, the power supply for the amplification stage comprises a multi-level D.C. power supply having three terminals of p ositive voltage $+E_b$, $+2E_b$, and $+3E_b$, and three terminals of negative voltage $-E_b$, $-2E_b$, and $-3E_b$. The number of supply voltage levels, of course, may be greater or less, depending on the specific application. The multi-level D.C. power supply can also take a variety of forms but is preferably a static transformer coupled converter with a multi-tapped secondary winding which may be driven by an external source or by a self-synchronous oscillator.

The terminal of the positive voltage supply which offers the lowest voltage, that is, the $+E_b$ terminal, in addition to being coupled to the voltage comparator 61 by conductor 66 is also coupled by a conductor 71 through diode 72 to the power conductor 27. In like manner the $-E_b$ terminal of the negative voltage supply which offers the smallest value of negative voltage in addition to its coupling to the voltage comparator 63 by conductor 68 is also coupled by a conductor 73 through diode 74 to the power conductor 37. These voltage supply levels therefore supply the amplification stage with minimum transistor voltage to keep the low signal power dissipation in the transistors to a minimum.

As shown in FIG. 1, the switching stage comprises switches 81 and 82 and the switches 83 and 84. One terminal of each switch 81 and 82 is coupled to the power conductor 27 by respective conductors 85 and 86 and the other terminals of the switches are connected to diodes 87 and 88, respectively. The diode 87 is connected to the $+2E_b$ of voltage tap by conductor 89 and diode 88 is connected to the $+3E_b$ voltage tap by the conductor 90. As arranged in the circuit, the diodes 87 and 88 can only pass current in the direction from the D.C. supply. The $+2E_b$ terminal, therefore, in addition to being coupled to the comparator 62, may also be selectively coupled to the power conductor 27 by operation of the switch 81 as controlled by the comparator 61. Switch 82 is controlled by comparator 62.

In similar manner one terminal of each switch 83 and 84 is coupled to the negative voltage conductor 37 by the respective conductors 91 and 92 and the other terminals of the switches are connected to the diodes 95 and 96, respectively. The diodes 95 and 96 are connected to the $-2E_b$ and $-3E_b$ voltage taps, respectively, on the negative side of the D.C. supply and as arranged in circuit permit current flow to the D.C. supply. The $-2E_b$ terminal, therefore, in addition to its direct coupling to the comparator 64 may also be selectively coupled to the power conductor 37 by operation of the switch 83.

Thus, the reference input to comparators 61 and 63 are the lowest positive and negative voltages, respectively, and the reference input to comparators 62 and 64 are the next higher levels of positive and negative voltages. The comparators are thus connected to compare the positive swing of the amplifier output voltage with the $+E_b$ and $+2E_b$ levels and the negative swing of the amplifier output voltage with the $-E_b$ and the $-2E_b$ levels of the supply.

The respective voltage comparators sample the load output voltage and when more voltage is needed by the amplification stages to avoid saturation of the transistors, the appropriate switch connects the next higher voltage terminal to the power conductor. The low voltage terminals of the power supply provide the power to the transistors until high voltage is impressed on the respective conductors by the switching circuit. When a power conductor carries a higher amplitude voltage, the diode in series with the low voltage terminal is reverse biased and consequently opens the circuit between the low voltage terminal and its associated power conductor.

This invention is easily applied to A.C. amplifiers which require a simpler power supply than a D.C. amplifier. Multiple levels of positive voltage are required for the power supply of an A.C. amplifier whereas the D.C. amplifier requires a power supply with multiple levels of positive and negative voltage.

Figure 2:
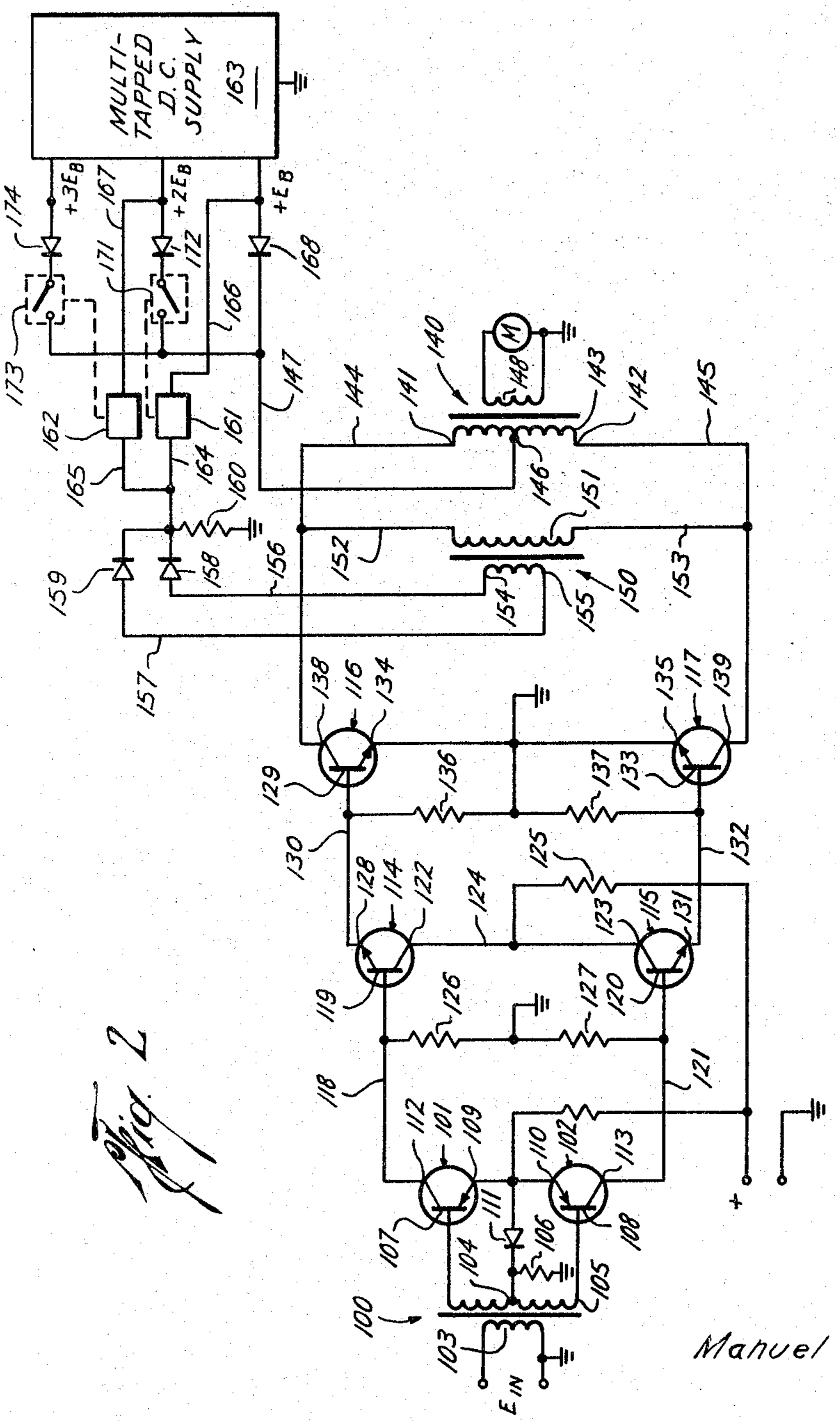
FIG. 2 is a schematic circuit diagram of an A.C. amplifier with a multi-level supply voltage in accordance with the invention.

In FIG. 2 there is shown a schematic circuit diagram of a class B transformer-coupled amplifier that lends itself to the power supply switching technique of this invention. The amplifier is a push-pull amplifier with output transistors arranged in grounded emitter configuration for satisfying the condition of high output impedance. This particular amplifier configuration is one which has proven highly successful as an A.C. supply in missile applications.

The technique of supply voltage switching for this circuit is essentially similar to that of the D.C. amplifier except that the voltage sampling comparison is made across both output transistors. If either transistor voltage decreases below a predetermined level then the power supply is switched to a next tap and if either transistor voltages exceed a value required by the load, then the power supply is switched to a lower level voltage.

The input stage for the A.C. amplifier consists of a transformer 100 and PNP type transistors 101 and 102 arranged in class B push-pull configuration. The voltage input signal from an A.C. signal generator whose signal is to be amplified is applied to the primary winding 103 of the transformer. The center tap 104 of the secondary winding 105 is coupled to ground through the resistor 106 and the output terminals of the secondary winding are coupled to the base terminals 107 and 108, respectively, of the two transistors. The emitter terminals 109 and 110 of the transistors are connected to the center tap 104 through diode 111. The first stage output signal appears across the respective collector terminals 112 and 113 of transistors 101 and 102.

The first stage signal is delivered to second and third stages, utilizing only NPN type transistors, the second stage comprised of transistors 114 and 115 and the third stage comprised of transistors 116 and 117. The first stage signal which appears at the collector of transistor 101 is applied through conductor 118 to base terminal 119 of transistor 114 and the first stage output signal from the collector terminal of transistor 102 is applied to base 120 of transistor 115 by conductor 121. Collector terminals 122 and 123 of transistors 114 and 115 are joined by conductor 124 and connected through a resistance 125 to a source of positive voltage. Base terminals 119 and 120 are also coupled to ground through biasing resistors 126 and 127. Emitter terminal 128 of transistor 114 is coupled to base terminal 129 of transistor 116 by conductor 130 and similarly emitter terminal 131 of transistor 115 is coupled by conductor 132 to the base terminal 133 of transistor 117. Emitter terminals 134 and 135 of transistors 116 and 117, respectively, are grounded and their base terminals are returned to ground through the respective biasing resistors 136 and 137. Collector terminals 138 and 139 of complementary transistors 116 and 117 provide the output signal.

The output stage of the amplifier system consists of a transformer 140 whose end terminals 141 and 142 of primary winding 143 are coupled to the collectors of amplifier output transistors 116 and 117 by conductors 144 and 145, respectively, to receive the amplified output signal. Center tap 146 is coupled to the power supply conductor 147 from the multi-level uni-polar power supply. The output voltage from the system is obtained from the terminals of secondary winding 148 of the transformer.

The voltage comparison circuitry is comprised of a transformer 150 whose primary winding 151 is coupled across the primary winding of the output transformer 140 by conductors 152 and 153. The terminals 154 and 155 of the secondary winding of the transformer are coupled by conductors 156 and 157, respectively, through respective diodes 158 and 159 to one terminal of a resistor 160 which is in turn coupled to ground. The diodes are arranged whereby only positive voltage passes from the secondary winding to the resistor.

One terminal of each voltage comparator 161 and 162 is coupled to the resistor 160 by conductors 164 and 165, respectively, and the other terminals of the comparators are connected by condutcors 166 and 167, respectively, to the voltage terminals of the D.C. power supply 163 which provide the voltage levels $+E_b$ and $+2E_b$. By this arrangement the comparators compare the voltage appearing across the resistor with the voltage at the D.C. power supply.

The terminal of the positive voltage supply which offers the lowest voltage, that is the $+E_b$ terminal, in addition to being coupled to the voltage comparator 161 is also coupled through the diode 168 to the power supply conductor 147. This lowest voltage supply terminal therefore supplies the amplification stage with minimum collector-to-emitter voltage to keep the low signal power dissipation in the power transistors to a minimum.

The $+2E_b$ terminal of the power supply, in addition to being coupled to the voltage comparator 162, can be connected to the power conductor 147 by the switching circuit which includes the switch 171, the series connected diode 172, and comparator 161. In like manner, the $+3E_b$ terminal is connected to power conductor 147 through the switching circuit which includes the switch 173, the series connected diode 174, and comparator 162. The comparator triggers the appropriate switch to connect the terminal offering the next higher level of voltage to the power supply conductor. This operation of the circuit is substantially identical to that for the D.C. amplifier of FIG. 1.

It will, therefore, be seen that the additional power supply voltage which is required to enable the transistors to amplify the higher levels and peaks of an input A.C. signal is supplied in discrete steps. Conversely, as the voltage comparators sense a decreasing voltage and the need for less power supply voltage, the comparator will then switch out the highest voltage terminal then being used from the power supply conductor. By the method of this invention, therefore, the higher voltages are disconnected from the transistors in the output stage when they are not needed, to thereby keep the collector-to-emitter voltages and transistor power dissipation to a minimum.

Figure 3:
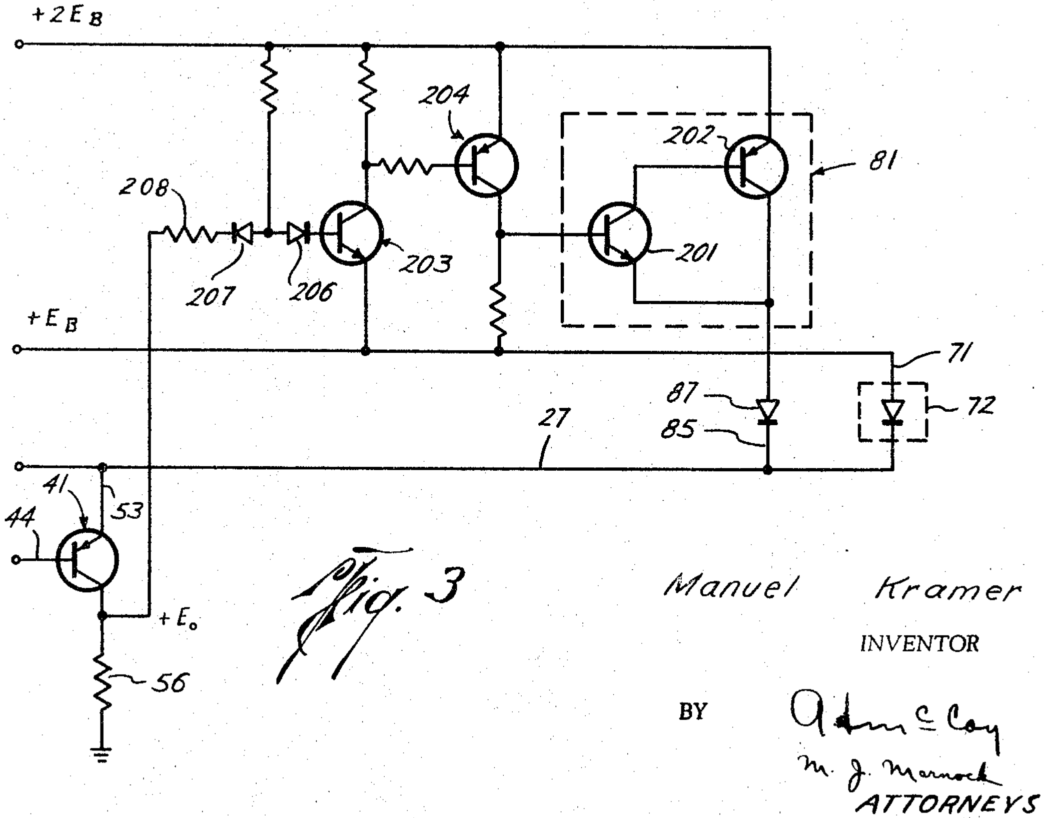
FIG. 3 is a schematic circuit diagram of a representative amplitude comparator and associated switching device which may be used in the circuits of the amplifiers shown in FIGS. 1 and 2.

There are several types of comparator circuits and associated switching devices for accomplishing switching between multiple D.C. power supply levels. A comparator and switching circuit such as shown in FIG. 3 might be used. The circuit as shown is connected to sample the voltage across the load in the amplifier of FIG. 1 and compare the sampled voltage to the positive voltage $+E_b$ from the D.C. power supply.

In operation of the circuit the diode switch 72 conducts constantly except when the switch 81, represented by the transistors 201 and 202 which are coupled collector to base, is made conductive by turning on of the transistor 203.

The collector of transistor 203 is connected to the base of transistor 204 whose collector is in turn connected to the base of transistor 201. The higher supply voltage $+2E_b$ automatically reverse biases the diode switch 72 when 202 is on. Since the emitter of transistor 203 is clamped to the voltage supply $+E_b$, transistor 203 is cut off so long as its base voltage is less than $+E_b$. Clamping the emitter of transistor 203 to the voltage of $+E_b$ compensates the detector reference level for variations in supply voltage.

With respect to the diode logic stage, the only function of diode 206 is to prevent the emitter-to-base diode of the transistor 203 from exceeding its reverse breakdown voltage. Diode 206 and the emitter base diode of transistor 203 may be considered as one diode for logic performance. The back to back diodes 207 and 206 have their cathodes referred to the output voltage of the amplifier and the voltage $+E_b$, respectively.

For an amplifier output voltage less than $+E_b$, the detector voltage equals the output voltage. Consequently, transistor 203 and the switch 81 are nonconductive and the voltage across the transistor 41 equals the voltage $+E_b$ as delivered through the switch 72. As the output voltage approaches the value $+E_b$, the amplifier transistor 41 approaches saturation. By adding the resistor 208 in series with the diode 207, the detector reference level may be adjusted. With the reference level set so that switching occurs just before the amplifier output transistor 41 saturates, the detector voltage will cause the transistor 203 and transistor 202 to saturate and the voltage across the amplifier transistor will then equal $+2E_b$. The amplifier output transistor will then move away from its saturation voltage by the amount of the supply increment. Further increases in amplifier output voltage will not affect the voltage across the transistor 41 but will only cause it to saturate at a collector emitter voltage equal to $+2E_b$. After the load voltage reaches a peak value and begins to decrease below the detector level, transistor 203 and the diode 87 become inoperative and the switch 72 connects the voltage $+E_b$ to the circuit.

The switching circuit of FIG. 3 is designed to be used only with the top half of the class B amplifier of FIG. 1. However, the switching circuit for the bottom half of the amplifier can be identical in configuration except for the addition of a phase inverting transistor. All of the comparators and switching circuit referred to in the description of the amplifiers of FIG. 1 and FIG. 2 may be of this type.

It should be noted, however, that the operating points of power amplifying elements by their very nature vary over wide dynamic ranges and the variation of intrinsic parameters of these elements, due to operating point change, often result in non-linearities in their transfer function. These should be corrected, at least to the extent of the primary transfer function specification and are usually minimized by the use of negative voltage feedback. Both of the circuits described in FIGS. 1 and 2 readily lend themselves to this type of feedback with accepted techniques that assure adequate phase and gain margin.

With regard to fast transients introduced by the switching supply it should be noted that as in the case of all environmental disturbance correction by the use of negative voltage feedback, the effect can be minimized only by increasing the band width of the loop which encompasses the characteristic equation of the disturbance transfer function. The band width of this loop, therefore, constitutes the limitation of this technique in certain special cases where the load requires a large signal to noise ratio over a very wide frequency range. For most applications of these amplifiers, however, the load acts as low pass filters and consequently small rapidly decaying transients are of no concern.

In the circuits of FIG. 1 and FIG. 2 the voltage levels available at the terminals of the D.C. power supply are selected as integral multiple values. The choice of voltage levels, however, is arbitrary inasmuch as selection is indicated by the character of the input signal. In most instances, a further increase or optimization of circuit efficiency for a given number of voltage levels can be achieved by optimum selection of the supply step magnitudes. This optimum selection can be computable mathematically from the power integral expression for the multi-level supply system in accordance with the character of output signal.

It should be understood, of course, that the foregoing disclosure relates only to preferred embodiments of the invention and that it is intended to cover all changes and modifications of the examples in the invention herein chosen for the purposes of the disclosure which do not constitute departure from the spirit and scope of the invention.

What is claimed and desired to be secured by Letters Patent is:

1. In a power amplifying system:
a transistor amplifier having a power control transistor for regulating the voltage applied to a load;
a multi-terminal D.C. power supply providing multiple voltage levels;
means connecting one of the voltages of the power supply across said power control transistor of the amplifier;
means for applying the output voltage of the amplifier across said load; and
means for switching the connection of the power supply to said transistor in accordance with load voltage requirements to selectively connect the minimum voltage of the available power supply voltages across said transistor which is sufficient to maintain linear operating characteristics of the amplifier.

2. In a linear power amplifying system:
a class B multistage transistor amplifier having a first transistor in the output stage for regulating the positive supply voltage applied to a load and a second transistor in the output stage for regulating the negative supply voltage applied to said load, said transistors being arranged in common electrode configuration providing a high dynamic output impedance;
a multi-terminal power supply providing multiple levels of positive voltage and multiple levels of negative voltage;
means connecting one of the positive voltages of the power supply across said first output transistor of the amplifier;
means connecting one of the negative voltages of the power supply across said second output transistor of the amplifier;
means for applying the output voltage of the amplifier across said load; and
means for switching the connection of the positive voltage power supply with said first transistor in accordance with the voltage across said first transistor to selectively connect the minimum positive voltage of the available power supply voltages across said first transistor which is sufficient to avoid saturation of the first output transistor and maintain linear operating characteristics of the amplifier; and means for switching the connection of the power supply with said second transistor in accordance with the voltage across said second transistor to selectively connect the least negative voltage of the available power supply voltages across said second output transistor which is sufficient to avoid saturation of the second output transistor and maintain linear operating characteristics of the amplifier.

3. In a linear power amplifying system:
a class B multistage transistor amplifier having a first power transistor in the output stage for regulating the positive supply voltage applied to a load and a second power transistor in the output stage for regulating the negative supply voltage applied to said load, said transistors being arranged in common emitter configuration;
a multi-terminal D.C. power supply providing multiple levels of positive voltage and multiple levels of negative voltage;
means connecting one of the positive voltages of the power supply across said first power transistor of the amplifier;
means connecting one of the negative voltages of the power supply across said second power transistor of the amplifier;
means for applying the output voltage of the amplifier across said load;
means for switching the connection of the positive voltage power supply to said first transistor in accordance with load voltage requirements to selectively connect the minimum positive voltage of the available power supply voltages across said first transistor which is sufficient to maintain linear operating characteristics of the amplifier; and
means for switching the connection of the negative voltage power supply to said second transistor in accordance with load voltage requirements to selectively connect the least negative voltage of the available power supply voltages across said second output transistor which is sufficient to maintain linear operating characteristics of the amplifier.

4. A power amplifying system comprising:
an electronic amplifier having a first power control device for regulating the positive voltage applied to a resistive load and a second power control device for regulating negative voltage applied to said resistive load, said power control devices being arranged in a configuration to provide a high dynamic output impedance;
a multi-terminal D.C. power supply providing multiple levels of positive voltage and multiple levels of negative voltage;
means for connecting the least positive of the positive voltages of the power supply across said first power control device of the amplifier;
means for connecting the least negative of the negative voltages of the power supply across said second power control device of the amplifier;
means for applying the output voltage of the amplifier across said resistive load;
means for comparing the amplitude of a positive load voltage to said least positive voltage of the power supply;
means for switching the connection of the positive voltage supply to said first power control device to the next higher level of positive voltage supply as the load voltage nears the value of said first positive voltage;
means for comparing the amplitude of a negative load voltage to said least negative voltages of the power supply; and
means for switching the connection of the negative voltage supply to the second power control device to the next more negative level of voltage supply as the amplitude of the negative load voltage nears the value of said least negative voltage whereby the negative voltage supplied to said second power control device is increased.

5. A power amplifying system comprising:
an amplifier having power amplifying transistors in the output stage arranged in common electrode configuration providing a high dynamic output impedance;
a multi-terminal power supply providing multiple levels of supply voltage;
means connecting one of the voltages of the power supply across each of the output transistors of the amplifier;
means applying the output voltage of the amplifier across a resistive load; and
means for switching the connection of the power supply to the transistors in accordance with load voltage amplitude to selectively connect across each of the output transistors the minimum voltage of the available power supply voltages which is sufficient to maintain linear operating characteristics of the amplifier.

6. A power amplifying system comprising:
a class B multistage amplifier having power amplifying transistors in the output stage arranged in common emitter configuration;
a multi-terminal power supply providing multiple levels of supply voltage;
means connecting one of the voltages of the power supply across each of the output transistors of the amplifier;
means applying the output voltage of the amplifier across a resistive load;
means for sensing the amplitude of the load voltage and comparing the amplitude of the load voltage with reference voltage levels of the power supply; and
means for switching the connection of the power supply to the transistors in accordance with load voltage amplitude to selectively connect across each of the output transistors the minimum voltage of the available power supply voltages which is sufficient to avoid saturation of the transistors and thereby maintain linear operating characteristics of the amplifier.

7. A power amplifying system comprising:
a multistage amplifier having power amplifying transistors in the output stage arranged in common-emitter configuration;
a multi-terminal power supply providing multiple levels of positive voltage for forward biasing said transistors;
means connecting one of the voltages of the power supply across each of the output transistors of the amplifier;
means applying the output voltage of the amplifier across a load;
a plurality of comparator means for sensing the amplitude of the load voltage and comparing the amplitude of the load voltage with reference voltage levels of the power supply; and
switching means associated with said comparator means for switching the connection of the power supply with said transistors in accordance with load voltage amplitude to selectively connect across each of the output transistors the next higher voltage of the available power supply voltages when the load voltage exceeds said one power supply voltage and for switching back to apply said one power supply voltage across each transistor when the load voltage drops below said one power supply voltage to thereby improve the power conversion efficiency of the amplifier.

8. A power amplifying system comprising:
an amplifier having a power amplifying element and a high dynamic output impedance;

a multi-terminal power supply providing multiple levels of supply voltage;

means connecting one of the voltages of the power supply across said power amplifying element of the amplifier;

means applying the output voltage of the amplifier across a load; and means switching the connection of the power supply to the power amplifying element in accordance with load voltage amplitude to selectively connect across said power amplifying element the minimum voltage of the available power supply voltages which is sufficient to maintain linear operating characteristics of the amplifier.

References Cited by the Applicant

UNITED STATES PATENTS

| | | |
|---|---|---|
| 2,782,266 | 2/1957 | Belar. |
| 2,927,225 | 3/1960 | Phillips. |
| 2,955,213 | 10/1960 | Schaere. |
| 2,994,834 | 8/1961 | Jones. |
| 3,015,075 | 12/1961 | Bargellini. |

ROY LAKE, *Primary Examiner.*

E. C. FOLSOM, *Assistant Examiner.*